United States Patent [19]
Sato et al.

[11] Patent Number: 5,539,699
[45] Date of Patent: Jul. 23, 1996

[54] FLASH MEMORY TESTING APPARATUS

[75] Inventors: Shinya Sato, Meiwa-mura; Hiromi Ohshima, Ina-machi, both of Japan

[73] Assignee: Advantest Corporation, Tokyo, Japan

[21] Appl. No.: 304,583

[22] Filed: Sep. 12, 1994

[30] Foreign Application Priority Data

Sep. 10, 1993 [JP] Japan ................................. 5-225545

[51] Int. Cl.$^6$ ................................................. G11C 29/00
[52] U.S. Cl. .................. 365/201; 365/185.33; 371/21.1; 371/21.2
[58] Field of Search ................................. 371/21.1, 21.2; 365/201, 900, 185.33

[56] References Cited

U.S. PATENT DOCUMENTS

| | | | |
|---|---|---|---|
| 4,414,665 | 11/1983 | Kimura | 371/21.2 |
| 5,062,109 | 10/1991 | Ohshima | 371/21.2 |
| 5,291,449 | 3/1994 | Dehara | 365/201 |
| 5,363,382 | 11/1994 | Tsukakoshi | 371/21.2 |

Primary Examiner—David C. Nelms
Assistant Examiner—Son Mai
Attorney, Agent, or Firm—Knobbe, Martens, Olson & Bear

[57] ABSTRACT

A flash memory testing apparatus is capable of testing a flash memory while maintaining the conventional memory test functions. The flash memory testing apparatus obtains the number of programming pulses applied to each address of the flash memory. The flash memory testing apparatus executes the following steps: comparing a readout data of the flash memory under test under a writing or erasing test with an expected data output from a test pattern generator, outputting a failure signal to a failure analysis memory to store the failure data in a memory part in the failure memory in case where readout data does not coincide with an expected data, and outputting a pass signal when the readout data coincides with the expected data. The flash memory testing system has a counter for counting the number of programming pulses or erasing pulses and supplying the count data to the memory part of the failure analysis memory.

6 Claims, 8 Drawing Sheets

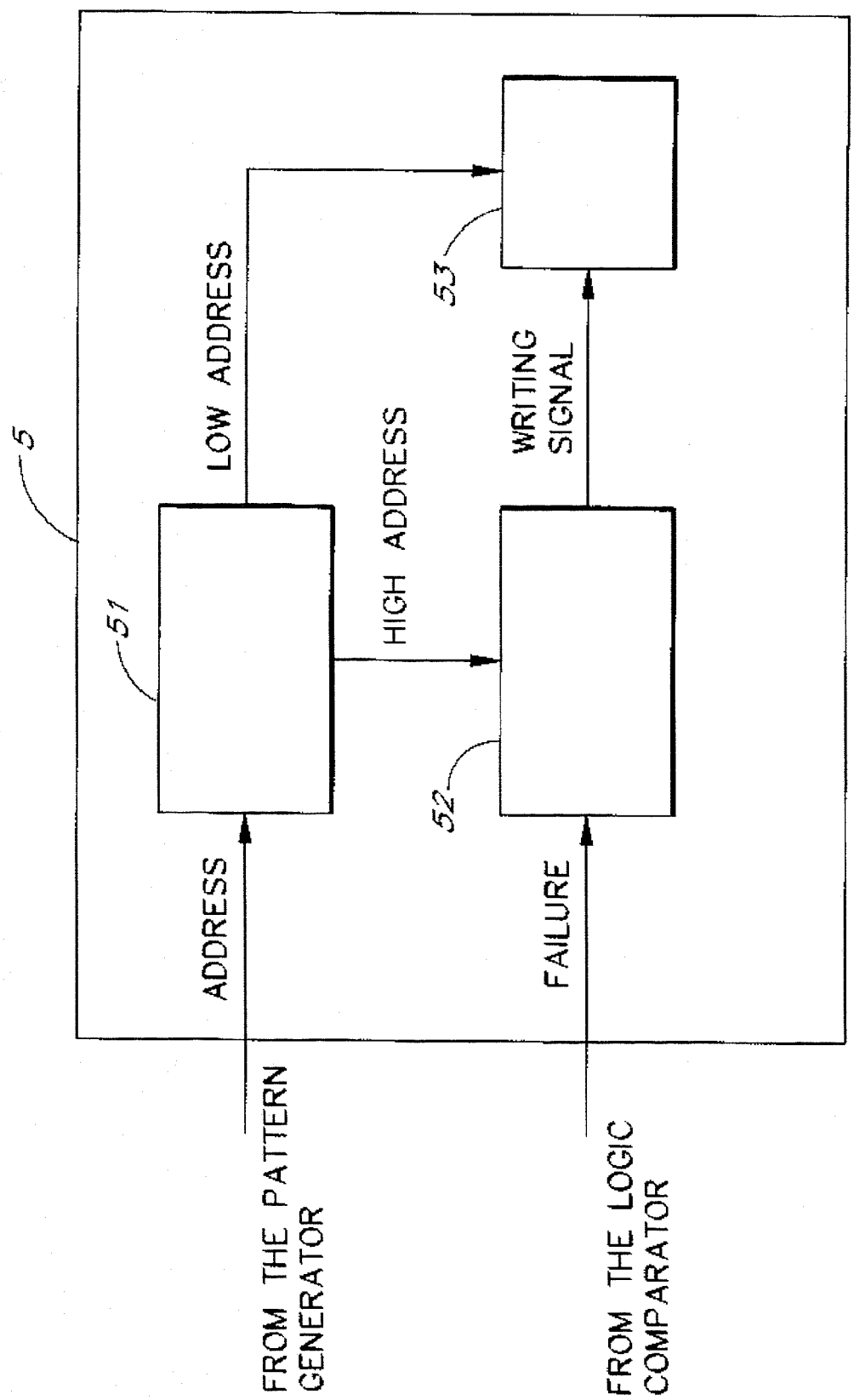

FLASH MEMORY TESTING APPARATUS

This invention relates to a flash memory testing apparatus, and more particularly, to a flash memory testing apparatus which counts the number of times a programming or erasing pulse for the flash memory has been applied thereto and stores the counted data in a failure analysis memory.

BACKGROUND OF THE INVENTION

FIG. 5 shows a general structure of a semiconductor memory testing apparatus. The semiconductor memory testing apparatus is comprised of a timing generator 1, a test pattern generator 2, a waveform shaper 3, a logic comparator 4 and a failure analysis memory 5, to examine whether a memory under test (hereinafter referred to as "MUT") works correctly or not.

The test pattern generator 2, which is provided with a reference clock CK that the timing generator 1 generates, outputs an address signal ADRS, a test pattern data signal TPD and a control signal CS to be supplied to the MUT. These signals are first applied to the waveform shaper 3 wherein they are wave-shaped into required waveforms to be sent to the MUT. The control signal CS is used for read/write control of the test pattern data TPD for the MUT.

The read-out data from the MUT which is the result of the test pattern data TPD is applied to the logic comparator 4 and then compared with expected data E output from the pattern generator 2 to examine whether a match has occurred between the read-out data and the expected data or not. Namely, the comparator 4 determines whether the MUT passes or fails a test. If disagreement occurs in the test result, a failure signal FS is supplied to the failure analysis memory 5 by the logic comparator 4. Failure data FD is stored in a memory cell of the failure analysis memory 5 specified by an address signal ADRS output from the test pattern generator 2 by the timing of the fail signal from the logic comparator 4. After the test has been completed, the contents stored in the failure analysis memory 5 are analyzed.

FIG. 6 shows an internal configuration of the failure analysis memory 5. This failure analysis memory 5 is mainly comprised of an address selecting part 51, a memory control part 52 and a memory part 53.

The address selecting part 51 has a function of selecting a part of the address signal ADRS generated by the test pattern generator 2. A higher address selected by the address selecting part 51 is applied to the memory control part 52 and a lower address selected by the address selecting part 51 is applied to each memory unit which forms the memory part 53.

The memory part 53 consists of several blocks each of which is formed of, for example, a 18-bit memory and stores therein the failure data FD corresponding to each address of the MUT or each MUT among the plurality of MUTs under the memory testing. With reference to FIG. 7, the following description explains how to store the failure data FD into the failure analysis memory 5 in the memory testing apparatus. If a certain address of the MUT fails in the memory test, a failure signal FS makes the failure analysis memory 5 store and hold "1" at the address corresponding to the failure address of the MUT by controlling a WE (write enable) or CS (control signal) terminal of the failure analysis memory 5. FIG. 7a shows an example of circuit configuration for storing the fail data through the WE terminal while FIG. 7b shows a configuration for storing the fail data through the control of the CS terminal.

The memory control part 52 consists of an address decoding part, a failure formatting part and a read data formatting part. The address decoding part decodes a higher address than that of the memory unit forming the memory part 53 and outputs a signal for selecting memory unit according to the number of bits in the MUT and also according to the number of MUTs which are under a simultaneous and parallel test by the memory testing apparatus.

The read data formatting part is for the failure analysis after taking the failure data in the memory section 53. The read data formatting part outputs a signal to select the failure data FD to be output from the memory section 53 according to the number of bits in the MUT and also according to the number of MUTs which are under the simultaneous and parallel test by the memory testing apparatus. The failure formatting part selects a failure signal output from the logic comparator corresponding to each test pin of the MUT, according to whether the number of bits in the MUT and the number of MUTs in the test is single or plural, and applies the selected failure signal to the memory part 53. Further, the logical product (AND) of the selection signal output from the address decoding part and the failure signal selected in the failure formatting part is applied to the memory part 53 as a failure signal.

The following description explains a procedure for testing a flash memory by writing a program and evaluating the program with reference to FIG. 8. As is well known in the art, the flash memory is used as an erasable read only memory (ROM). In the use of the flash memory, the writing data in the memory is usually called the "program" as above. The flash memory test is performed as follows.

After writing data in each address of the MUT (flash memory), or equivalently, after the programming, it is verified that the data is written correctly for each address. In this programming process, a programming pulse is also applied to the MUT each time the data is written in the specific address for activating the MUT. If the program (data) was not successfully written in the address within a cycle, the program-writing is repeated until the data is correctly written therein. If the program is written at the last address of the flash memory, the programming test is completed.

Next, an erasing test will be described. All the data in the flash memory is set to "0" in the erasing operation, i.e., the data "0" is written in all the addresses of the MUT. The difference between the erasing operation and a programming operation is an area where data is written. Under the erasing operation, data is written into each block of the MUT. Here, a block means a group of plural addresses. The erasing operation is available in two ways: an operation for erasing the whole memory at once and an operation for erasing one block of memory at a time.

After erasing the whole MUT or each block of the MUT, the first address of the area (whole memory or block) where the erasing operation has been executed is specified for verification and a pass/failure signal output from the logic comparator 4 is recognized. If the pass signal is output, the test is proceeded to the subsequent address in the area wherein the data in the address is compared with the expected data "0". If the subsequent addresses passes, the third address is specified and compared. In this way, the verification of the erase operation is continued to the last address of the area where the erasing operation was executed unless there is a fail in the subsequent address. If the final address of the area passes, the whole MUT or the block of the MUT is judged to be pass.

In case where the first address fails, the erasing operation is applied again. If the first address passes after the erasing operation applied again, the test proceeds to the subsequent address wherein the data in the address is compared with the expected data "0". On the other hand, if the address fails after the erasing operation applied again, the erasing operation is repeated until the address in question passes. If the erasing operation must be repeated up to the determined time, the whole MUT or the block of the MUT is judged to be failure. This process is applied to any addresses in the area until the last address so that each address is evaluated as to whether the total number of failure in the area for erasing the data exceeds the determined time.

In this procedure of testing the flash memory, it would be convenient for the user if the flash memory testing apparatus is capable of counting and storing the number of times the programming pulse data or erasing pulse data is applied to the flash memory under test. The presently available flash memory testing apparatus, however, does not have such a function of counting and storing the data of the number of programming pulses or erasing pulses applied to the flash memory.

SUMMARY OF THE INVENTION

It is a purpose of the present invention to provide a flash memory testing apparatus which is capable of counting the number of programming pulses or erasing pulses supplied to the flash memory under test and storing the counted number in the failure analysis memory.

According to the present invention, the flash memory testing apparatus operates as follows:

First the logic comparator compares the readout data of the flash memory MUT where a programming (writing) or erasing test is executed with the expected data output from the test pattern generator. Then, if the readout data does not coincide with the expected data, the failure analysis memory stores the failure data in the address of the memory part specified by an address signal output from the test pattern generator in receiving the failure signal.

A counter is provided in the failure analysis memory to count the number of pulses repeatedly provided to a specified address (programming test) or to a specified block (erasing test) of the flash memory. If the readout data coincides with the expected data, the counter 54 counts the number of times the programming or erasing pulse is written, and supplies the counted data to the memory part of the failure memory with the pass signal as an input signal.

According to the present invention, every time the programming signal is applied to a specific address of the MUT, the counter receives the programming pulse from the logic comparator and counts the number of the programming pulses applied to the address. Similarly, every time the erasing signal is applied to a specific address in the block of the MUT, the counter receives the erasing pulses from the logic comparator and counts the number of the erasing pulses applied to the address. In this way, the number of programming and erasing at each address can be counted.

BRIEF DESCRIPTION OF THE DRAWINGS

FIG. 6 shows an internal configuration of the failure analysis memory.

DETAILED DESCRIPTION OF THE INVENTION

Figure 1:
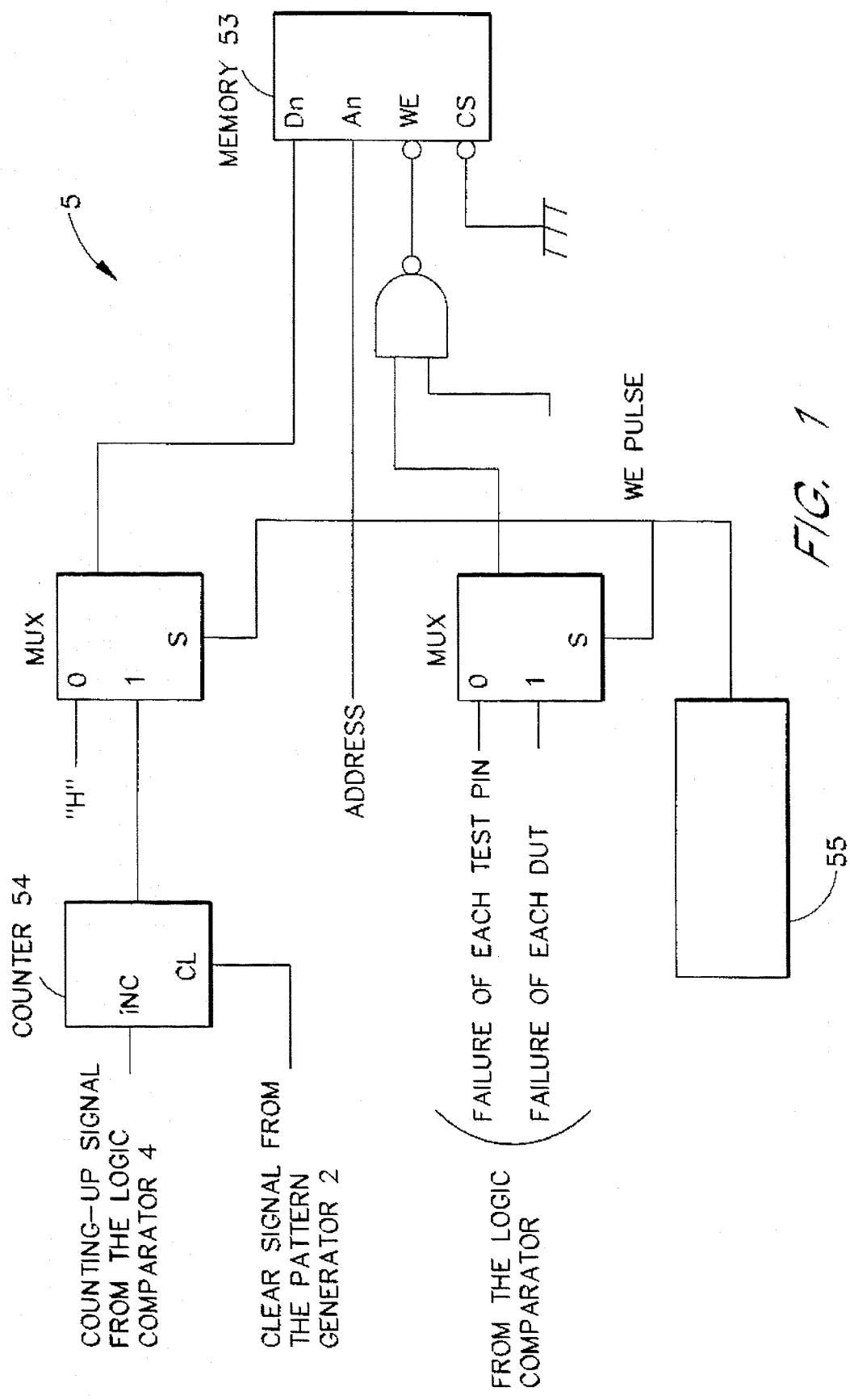
FIG. 1 shows block diagram of a preferred embodiment of the present invention.

Referring to drawings, an embodiment of the present invention will be described. First, referring to FIG. 1, the failure analysis memory 5 includes a counter 54 which counts the number of programming pulses or erasing pulses provided to the flash memory under test. The counter 54 supplies the counted data to the memory part 53 of the failure analysis memory 5 as an input signal through a multiplexer MUX. Failure signals with respect to each test pin or each of MUTs in the normal test are also applied to another multiplexer MUX so that the failure signal can initiate a writing operation of failure data in the memory part 53 when the data from the counter 54 is not selected. A selecting register 55 controls such selection between the counter 54 and the failure signal. In this way, not only a failure signal that is a writing signal is controlled with respect to each test pin, but controlled with respect to several bits of each MUT.

Every time the address to be applied to the MUT is incremented, a clear signal supplied by the test pattern generator 2 resets the counter 54 of the failure analysis memory 5. Therefore, the counter 54 is reset when the address of the MUT is shifted to the next address for the subsequent testing. Further, every time the programming pulse is repeatedly applied to the same address of the MUT, the counter 54 receives a count-up signal (corresponding to the programming pulse) from the logic comparator 4 and counts the number of programming pulses for the address. In this way, the number of programming operation at each address can be counted by the failure analysis memory 5.

Figure 2A:
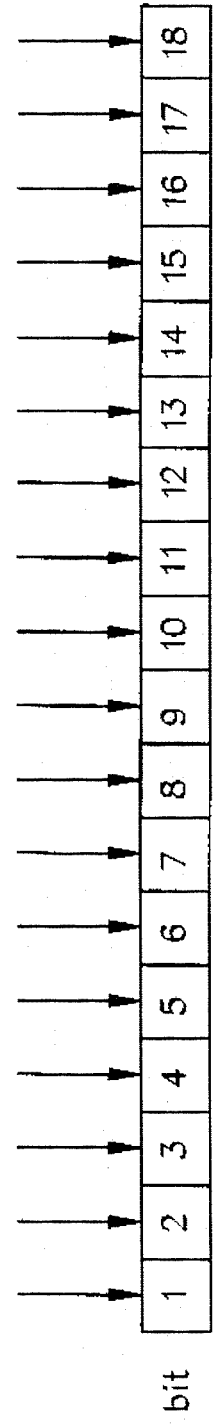
FIG. 2 is a graphic view for explaining the manner of writing failure data in a failure analysis memory.
Figure 2B:
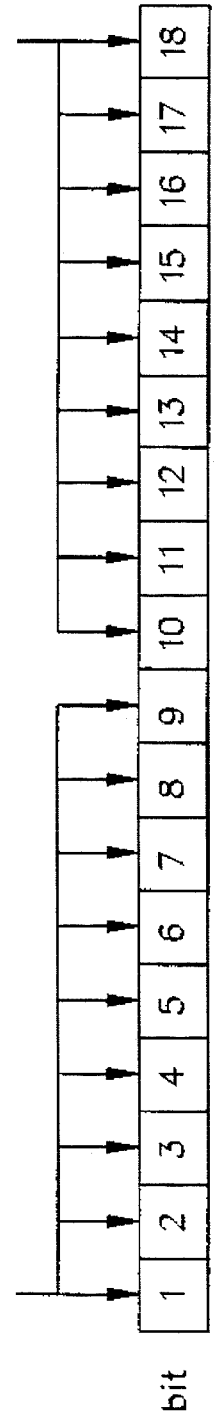

Further, a failure signal sent from the logic comparator 4 can control a writing of several bits, not corresponding to each test pin of the MUT but corresponding to each MUT. As shown in FIG. 2, the failure analysis memory 5 is comprised of a plurality of blocks each of which is a 18-bit memory. In the preferred embodiment, one block is divided into two memories and assigned to the two MUTs, respectively. Each divided block can count up to nine bits (551 counts). Thus, in case where more than two MUTs are simultaneously tested in parallel, the failure signal of each MUT is stored in the corresponding 9-bit divided block of the failure analysis memory 5. In the process relating to the writing of the failure signal in the simultaneous testing of the plurality of MUTs, the failure signal is not generated for the address which has completed the programming operation. Therefore, the number of times MUT was programmed can be stored.

By providing the selecting register 55 for switching between counting the number of programming and inputting a writing signal, the failure analysis memory 5 can store the number of programming while keeping the conventional functions of the memory testing apparatus.

Figure 3:
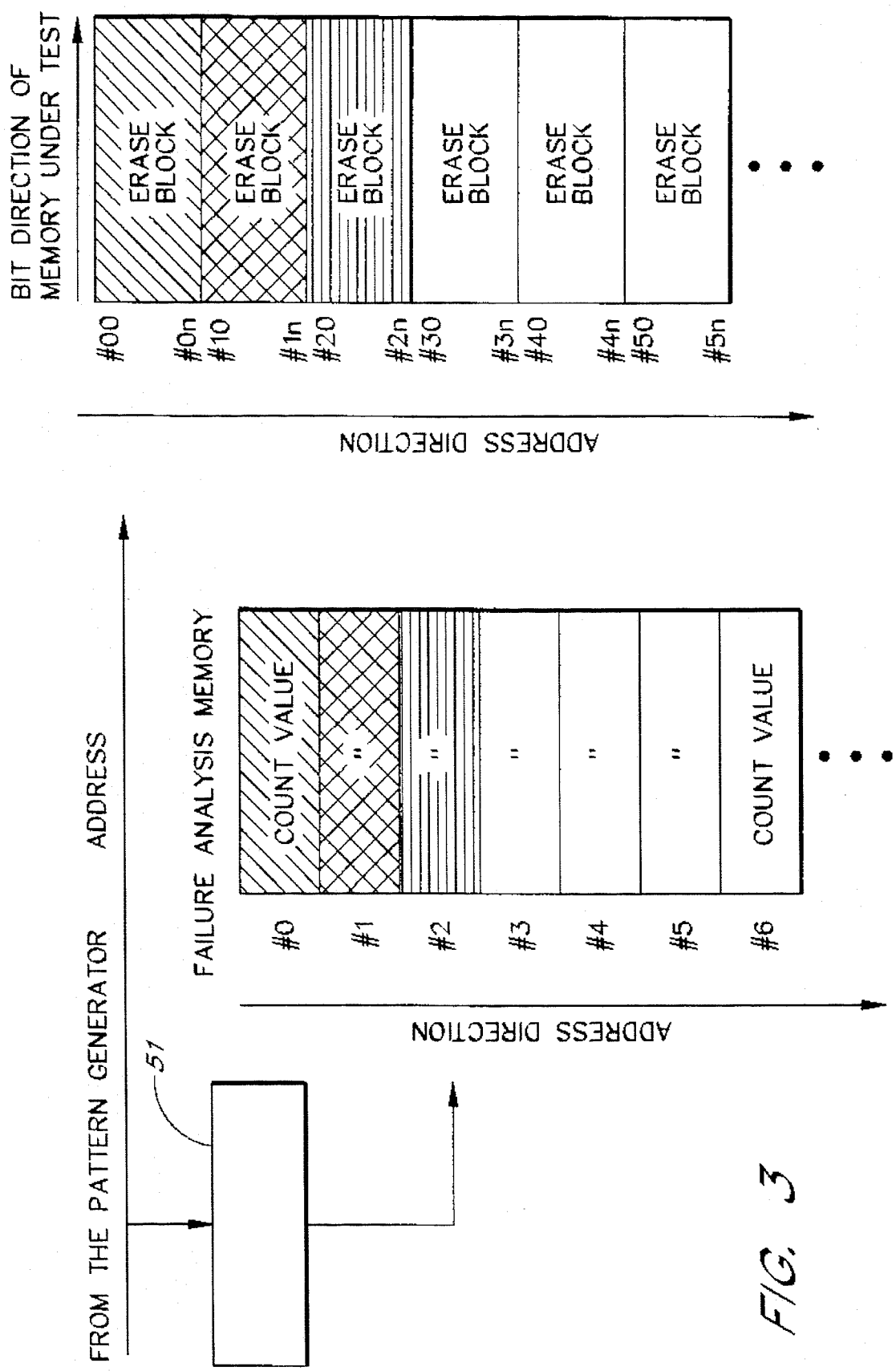
FIG. 3 is a graphic view for explaining an erasing operation in the present invention.

The erasing operation, however, differs from the programming operation and needs to the following control process to store the number of the erasing pulses for each block of the flash memory. As shown in FIG. 3, in order to erase programmed data in each block consisting of several addresses, the number of erasing pulses corresponding to each block is stored in the failure analysis memory 5. To accomplish this, a lower address (address corresponding to plurality of memory cells forming a block) is discarded in the address selecting section 51 and a higher address is applied to memory part 53. Therefore, one address of the failure analysis memory 5 corresponds to one block of the MUT and the number of the erasing pulses of one block can be stored into one address of the failure analysis memory 5.

Figure 4:
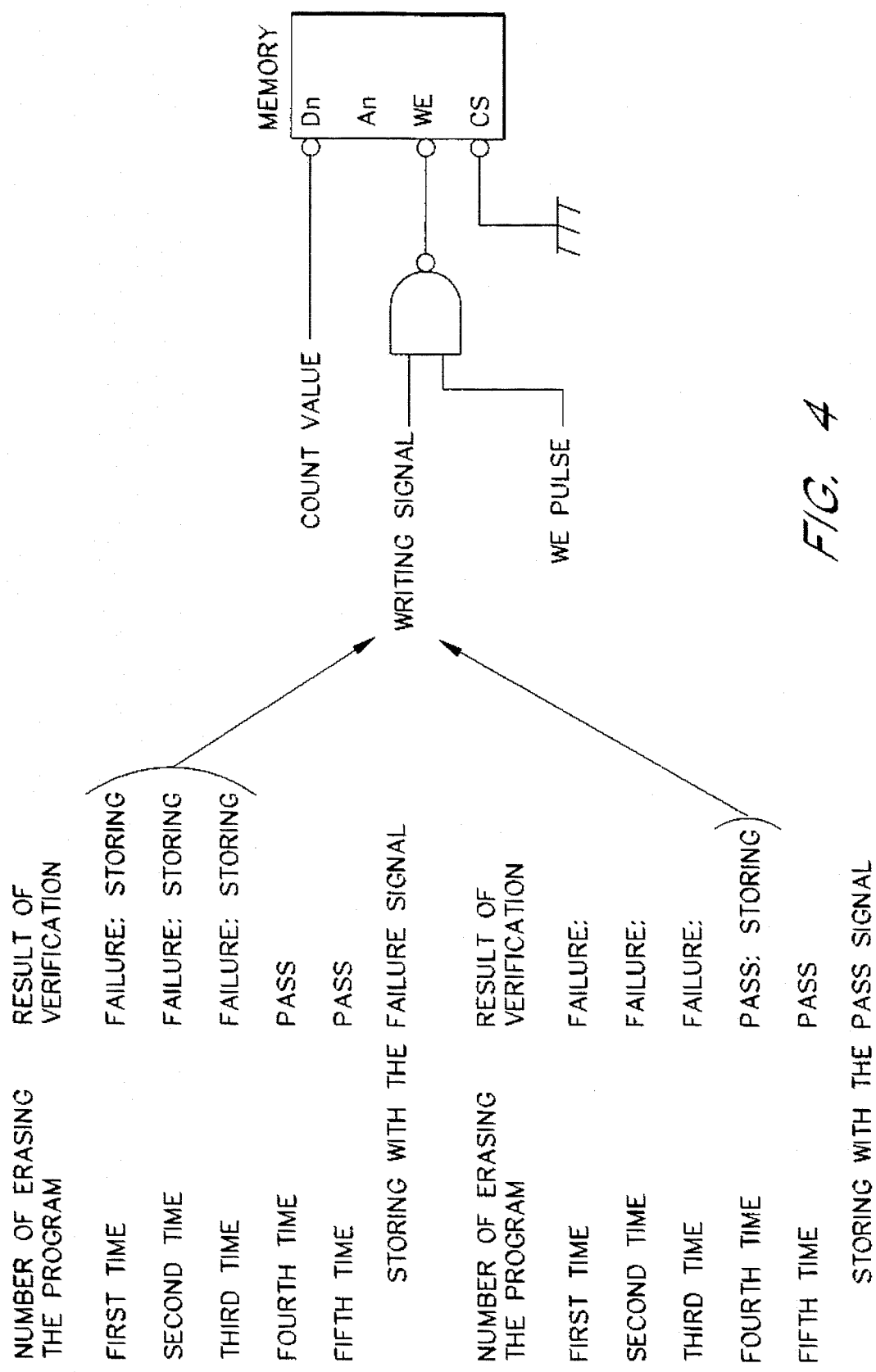
FIG. 4 is a graphic view of showing a writing process of counted data in the failure analysis memory in accordance with the present invention.
Figure 5:
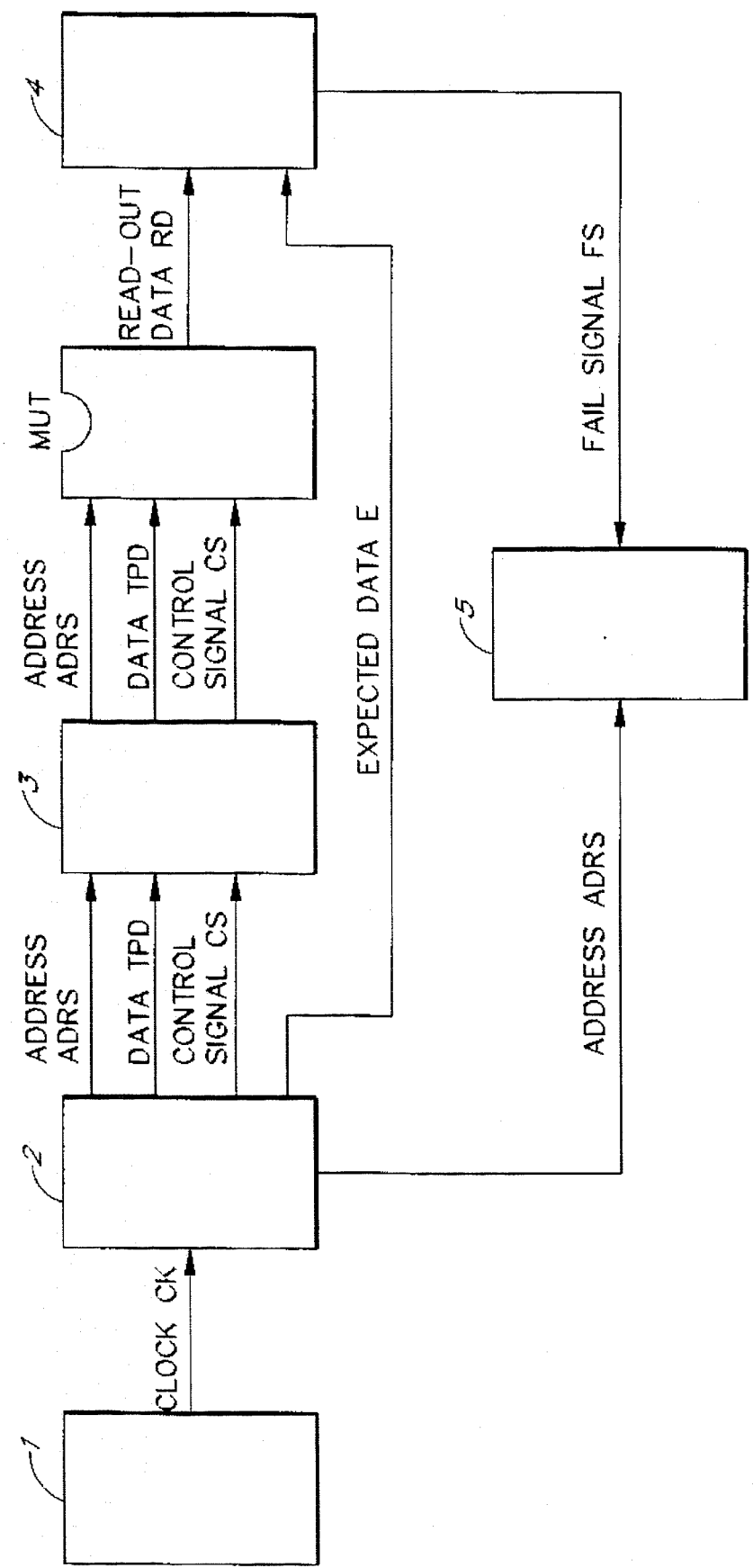
FIG. 5 is a block diagram showing a basic configuration of the semiconductor memory testing apparatus.
Figure 7A:
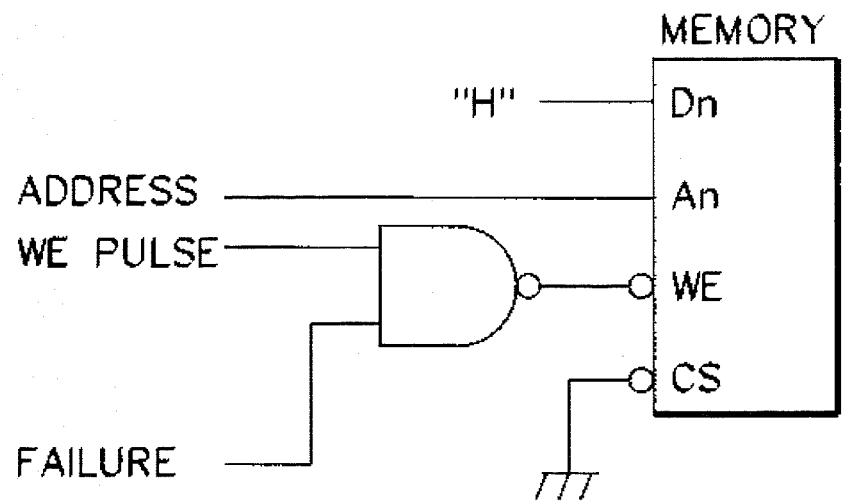
FIG. 7 is a circuit diagram for storing failure data in the memory testing apparatus.
Figure 7B:
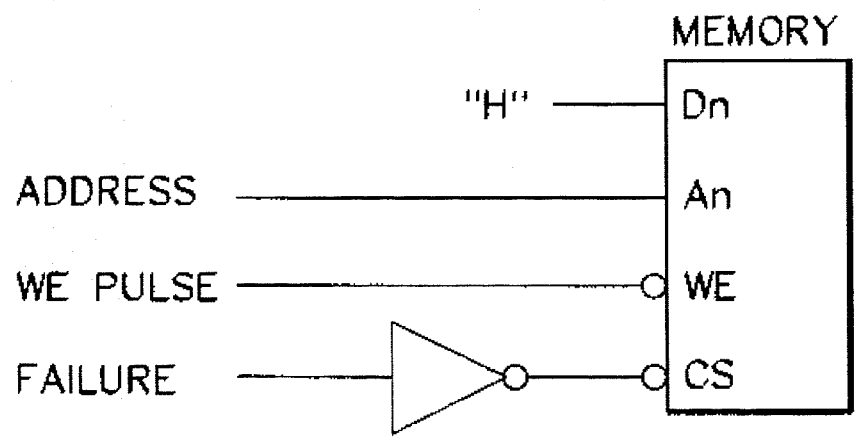
Figure 8:
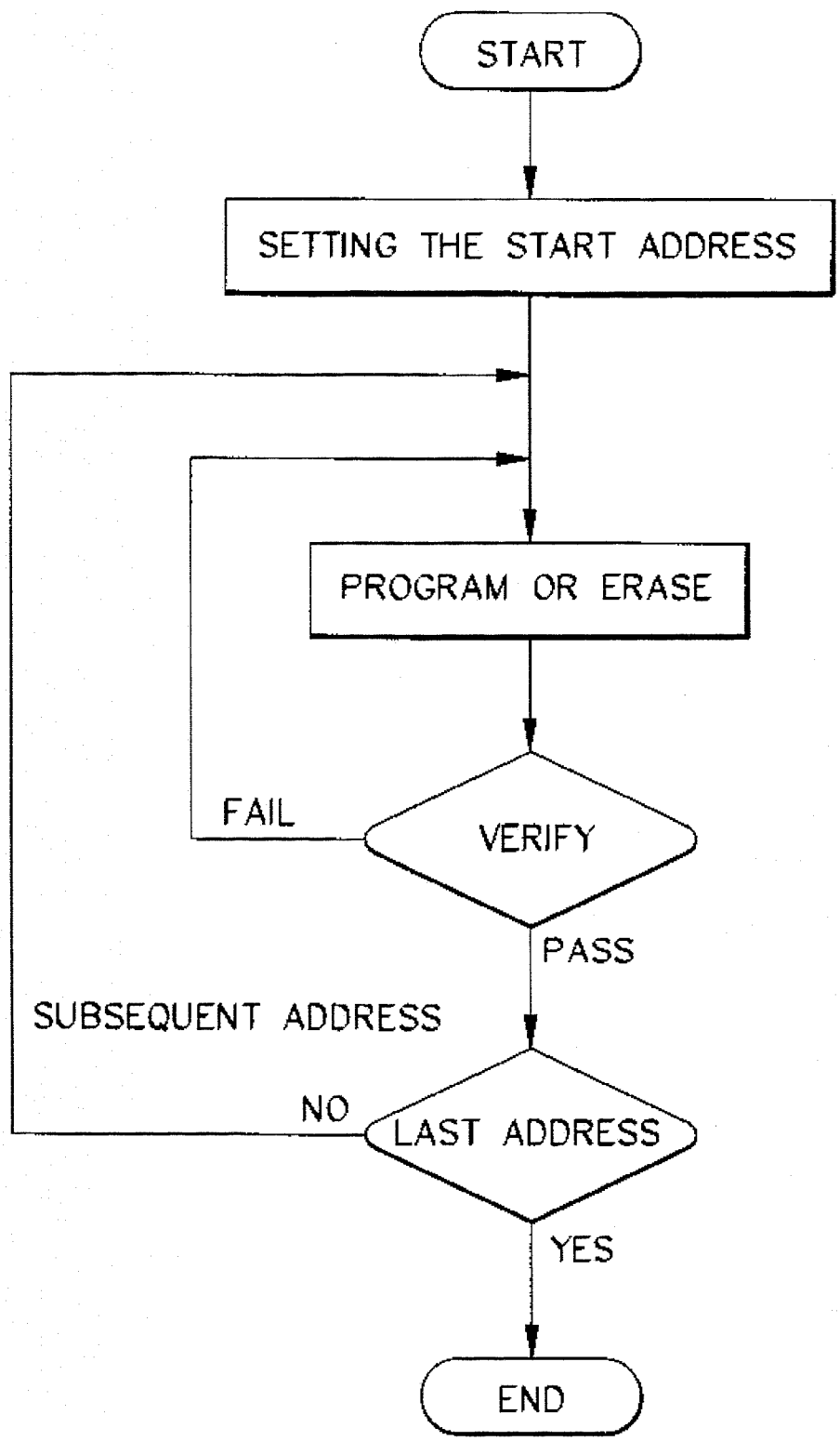
FIG. 8 is a flow chart showing a process for evaluating the flash memory by counting programming pulses and erasing pulses in the present invention.

In the above-described embodiment, the failure counts are stored in the failure analysis memory 5 whenever the failure signal of MUT is sent from the logic comparator 4. This is shown in the upper left portion of FIG. 4. Instead of writing the counted data whenever the failure signal of MUT provided, it is also possible to write the counted number in the failure analysis memory 5 by the timing of a first pass signal sent from the logic comparator 4 after verification. Namely, the pass counts are stored in the failure analysis memory 5 whenever the pass signal of MUT is sent from the logic comparator 4 as shown in the lower left portion of FIG. 4.

The above description is made with respect to one of the embodiments of the present invention. According to the present invention, the failure analysis memory 5 of the flash memory testing apparatus can store the number of programs, while keeping the conventional functions. In the flash memory testing apparatus, the memory part 53 of the failure analysis memory 5 stores the supplied count data. The flash memory testing apparatus, however, can include an additional memory to the failure analysis memory 5 to store the count data instead of using the conventional memory part 53.

The above described flash memory testing apparatus includes the selecting register for selecting the programming pulse count or the input of the writing signal. It is also possible to remove the selecting register to establish a memory testing apparatus which is specified to the flash memory testing.

What is claimed is:

1. A flash memory testing apparatus that compares readout data from a flash memory under writing or erasing test with expected data by a comparator and outputs a failure signal from said comparator in case of a mismatch between the readout data and the expected data, comprising:

a pattern generator that generates address data to define a memory cell of said flash memory, control data to determine either of the writing or erasing test for said memory cell and said expected data to compare with said readout data, said pattern generator repeatedly generating the same data for the same memory cell of said flash memory until said readout data and said expected data match with each other;

a counter connected to said comparator to count the number of pulses representing the number of repeatedly applying said same data from said pattern generator to said same memory cell of said flash memory under test; and a fail memory to store count data from said counter showing said number of pulses in a memory area determined by said address data from said pattern generator.

2. A flash memory testing apparatus as defined in claim 1, wherein a plurality of memory cells of said flash memory under test are repeatedly supplied with said same data at the same time until readout data from all of said memory cells match with said expected data during said erasing test.

3. A flash memory testing apparatus as defined in claim 1, wherein said counter is reset every time when an address for a next memory cell in said flash memory under test is incremented by said pattern generator after matching said readout data and said expected data for a present memory cell of said flash memory under test.

4. A flash memory testing apparatus as defined in claim 1 further includes:

a multiplexer connected to said counter to selectively provide to said fail memory either of said count data from said counter showing said number of pulses or fail data representing a failure of said memory cell of said flash memory under test based on said failure signal from said comparator; and a select register to provide a control signal to said multiplexer to select said count data or said fail data to said fail memory.

5. A flash memory testing apparatus as defined in claim 1, wherein a plurality of flash memories are tested in parallel at the same time and said fail memory is divided into a plurality of blocks to store fail data corresponding to said plurality of flash memories.

6. A flash memory testing apparatus as defined in claim 5, wherein said plurality of blocks in said fail memory are defined by higher order of said address data from said pattern generator.

* * * * *